United States Patent [19]
Staudinger et al.

[11] Patent Number: 5,757,237
[45] Date of Patent: May 26, 1998

[54] METHOD FOR DYNAMICALLY BIASING AN AMPLIFIER AND CIRCUIT THEREFOR

[75] Inventors: Joseph Staudinger, Gilbert; William B. Beckwith, Chandler, both of Ariz.

[73] Assignee: Motorola, Inc., Schaumburg, Ill.

[21] Appl. No.: 703,243

[22] Filed: Aug. 28, 1996

[51] Int. Cl.[6] ............................................. H03G 3/30
[52] U.S. Cl. ................................... 330/296; 330/285
[58] Field of Search ............................. 330/136, 140, 330/141, 279, 281, 285, 296

[56] References Cited

U.S. PATENT DOCUMENTS

| | | | |
|---|---|---|---|
| 3,708,756 | 1/1973 | Fajen | 330/296 |
| 4,442,407 | 4/1984 | Apel | 330/129 |
| 4,462,004 | 7/1984 | Cox et al. | 330/277 |
| 5,216,379 | 6/1993 | Hamley | 330/279 X |
| 5,392,464 | 2/1995 | Pakonen | 455/115 |
| 5,455,968 | 10/1995 | Pham | 455/127 |
| 5,559,471 | 9/1996 | Black | 330/296 X |

*Primary Examiner*—Steven Mottola
*Attorney, Agent, or Firm*—Gary Hoshizaki; Ziye Zhou

[57] ABSTRACT

A power amplifier (50) includes two transistors (11, 21) and a dynamic biasing circuit (52). The dynamic biasing circuit (52) uses a sampling circuit (54) to generate a bias adjusting signal proportional to the amplitude of an AC signal at a drain electrode of the first transistor (11). The bias adjusting signal is combined with a constant voltage bias signal to generate a dynamic biasing signal applied to a gate electrode of the second transistor (21). As the gain of the first transistor (11) decreases, the amplitude of the AC signal at its drain electrode decreases. Thus, the dynamic biasing circuit (52) generates a lower dynamic biasing signal at the gate electrode of the second transistor (21), thereby decreasing a quiescent drain current in the second transistor (21) and improving the efficiency of the amplifier (50) at low output power levels.

20 Claims, 1 Drawing Sheet

METHOD FOR DYNAMICALLY BIASING AN AMPLIFIER AND CIRCUIT THEREFOR

BACKGROUND OF THE INVENTION

The present invention relates, in general, to amplifiers and, more particularly, to power amplifiers.

In wireless communication applications, a radio frequency (RF) transmitter such as, for example, a transmitter in a cellular radio telephone typically includes a series of power amplifiers cascaded together to amplify an RF signal to a high power level. The amplified RF signal is then transmitted into space via an antenna. The power of the RF signal transmitted by the RF transmitter is adjusted to achieve an optimum transmission between the cellular telephone and a base station over vicarious effects such as transmission loss arising from the distance and/or obstacles between the cellular telephone and the base station. Typically the transmission power level of the cellular telephone is adjusted by commands from the base station. Power efficiency is a major concern in cellular telephone and other mobile wireless communication applications. Higher efficiency leads to longer operating time between battery recharges and/or smaller batteries.

Accordingly, it would be advantageous to have a power amplifier that is highly efficient over various output power levels.

DETAILED DESCRIPTION OF THE DRAWINGS

Figure 1:
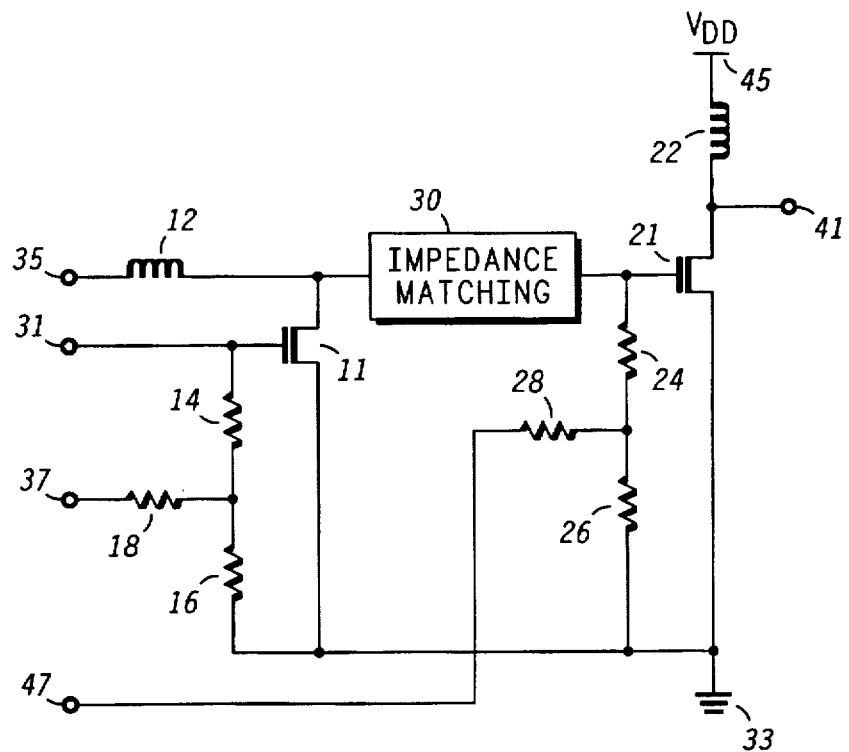
FIG. 1 is a schematic diagram of a power amplifier in accordance with prior art.

FIG. 1 is a schematic diagram of a power amplifier 10 in accordance with prior art. By way of example, power amplifier 10 is used to implement last two amplifier stages of a radio frequency (RF) transmitter (not shown) in a cellular telephone (not shown). Power amplifier 10 includes a metal semiconductor field effect transistor (MESFET) 11, an inductor 12, and resistors 14, 16, and 18 to implement the first amplifier stage. Power amplifier 10 also includes a MESFET 21, an inductor 22, and resistors 24, 26, and 28 to implement the second amplifier stage. An impedance matching element 30 matches the output impedance of the first amplifier stage to the input impedance of the second amplifier stage.

A source electrode of MESFET 11 is connected to a conductor 33 for receiving a reference voltage level such as, for example, ground voltage level. A drain electrode of MESFET 11 is coupled to a gain adjusting or gain control terminal 35 via inductor 12. A gate electrode of MESFET 11 is connected to an input terminal 31 for receiving an input signal of power amplifier 10. The gate electrode of MESFET 11 is also connected to an electrode of resistor 14. The other electrode of resistor 14 is coupled to conductor 33 via resistor 16 and coupled to a first bias terminal 37 via resistor 18.

A source electrode of MESFET 21 is connected to conductor 33. A drain electrode of MESFET 21 is connected to an output terminal 41 for transmitting an output signal of power amplifier 10. The drain electrode of MESFET 21 is further coupled to a conductor 45 via inductor 22 for receiving a drain bias voltage such as, for example, $V_{DD}$. A gate electrode of MESFET 21 is coupled to the drain electrode of MESFET 11 via impedance matching element 30. The gate electrode of MESFET 21 is also connected to an electrode of resistor 24. The other electrode of resistor 24 is coupled to conductor 33 via resistor 26 and coupled to a second bias terminal 47 via resistor 28.

In operation, the input signal of power amplifier 10 is transmitted to the gate electrode of MESFET 11 via input terminal 31. MESFET 11 generates an intermediate signal at its drain electrode by amplifying the input signal. The intermediate signal is transmitted to the gate electrode of MESFET 21 via impedance matching element 30. MESFET 21 amplifies the intermediate signal and generates the output signal of power amplifier 10 at output terminal 41.

The gate bias of MESFET 11 is determined by a voltage level at bias terminal 37 and the resistance ratio of resistor 16 to resistor 18. A voltage at gain control terminal 35 provides the drain bias of MESFET 11. Likewise, the gate bias of MESFET 21 is determined by a voltage level at bias terminal 47 and the resistance ratio of resistor 26 to resistor 28. A voltage at conductor 45 provides the drain bias of MESFET 21.

In one approach, the gate biases of MESFETs 11 and 21 are set by setting the voltage levels at bias terminals 37 and 47, respectively, using circuit techniques such as digital to analog converting. In another approach, the voltage levels at bias terminals 37 and 47 are fixed. Resistors 16 and 18 are trimmed at manufacturing to achieve a desired gate bias voltage level for MESFET 11 at its gate electrode. Similarly, resistors 26 and 28 are trimmed at manufacturing to achieve a desired gate bias voltage level for MESFET 21 at its gate electrode.

In accordance with the prior art, the desired gate bias voltage levels for MESFETs 11 and 21 are such that they generate sufficient quiescent drain currents in MESFETs 11 and 21, thereby ensuring an adequate gain of power amplifier 10 to achieve a maximum output power, such as the maximum output power commanded by a base station (not shown) in a cellular telephone system. It should be noted that power amplifier 10 operates in a large signal mode. Accordingly, the gain of power amplifier 10 is controlled by the voltage level at gain control terminal 35. When a lower output power is desired, circuitry (not shown) lowers the voltage level at gain control terminal 35 to reduce the gain of power amplifier 10, thereby decreasing the output power of power amplifier 10. However, as the output power of power amplifier 10 decreases, the efficiency of power amplifier 10 also decreases because of the fixed gate biases and fixed quiescent drain currents of MESFETs 11 and 21. The low efficiency of power amplifier 10 significantly reduces the operating time of the cellular telephone between battery recharges.

Figure 2:
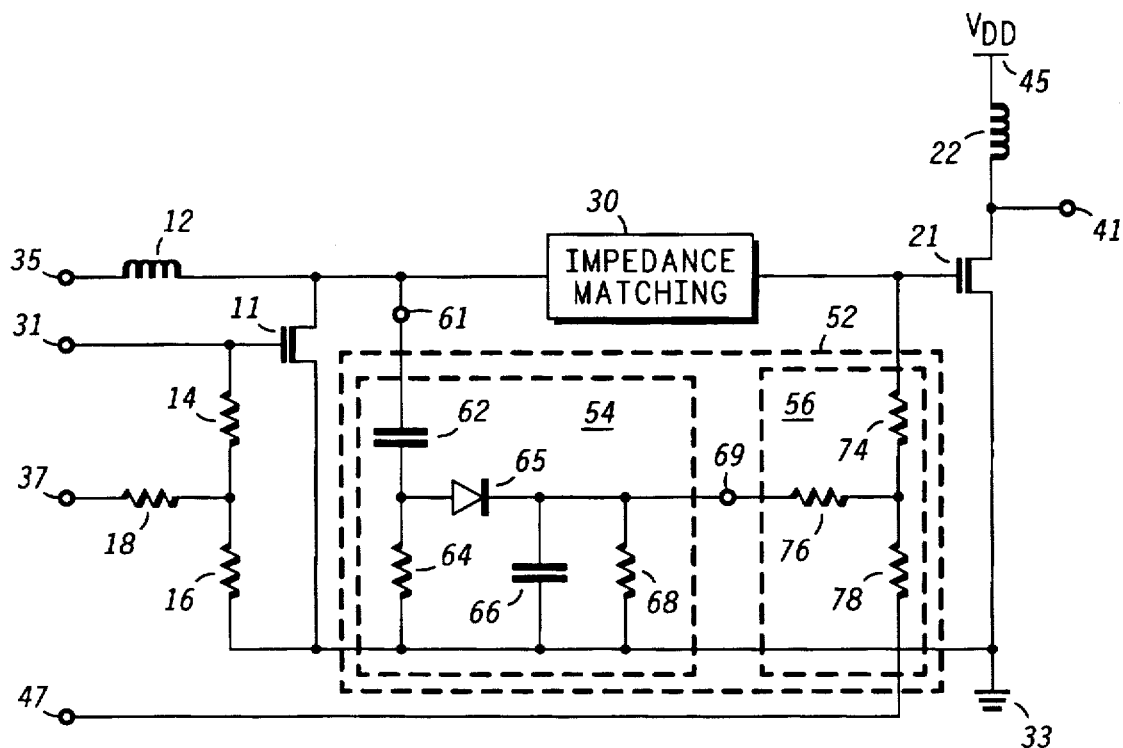
FIG. 2 is a schematic diagram of a power amplifier in accordance with the present invention.

FIG. 2 is a schematic diagram of a power amplifier 50 in accordance with the present invention. Like power amplifier 10 of FIG. 1, power amplifier 50 is a two stage variable gain amplifier. It should be noted that the same reference numbers are used to represent the elements serving the same circuit functions in FIGS. 1 and 2. By way of example, power amplifier 50 is an RF power amplifier in a cellular telephone (not shown).

The drain bias of MESFET 11 is provided by a gain control signal or gain adjusting signal applied to the drain electrode of MESFET 11 via gain control terminal 35 and inductor 12. The gate bias of MESFET 11 is determined by the bias voltage level at bias terminal 37 and a voltage divider formed by resistors 16 and 18. Resistor 14 serves as an alternating current (AC) signal blocking element to block the transmission of an AC signal from input terminal 31 to resistors 16 and 18.

The drain bias of MESFET 21 is provided by a voltage level such as, for example, a supply voltage level of $V_{DD}$ applied to the drain electrode of MESFET 21 via conductor 45 and inductor 22. The gate bias of MESFET 21 is dynamically controlled by a dynamic biasing circuit 52 which includes a sampling circuit 54 and a summing circuit 56. When the output power of power amplifier 50 decreases, dynamic biasing circuit 52 decreases the gate bias of MESFET 21, thereby reducing the quiescent drain current in MESFET 21. In a two stage amplifier, such as power amplifier 50, the quiescent current in the second amplifier stage, such as the quiescent drain current in MESFET 21, is usually larger than the quiescent current in the first amplifier stage, such as the quiescent drain current in MESFET 11. Therefore, dynamically biasing MESFET 21 is an effective approach for improving the efficiency of power amplifier 50.

Sampling circuit 54 is formed by capacitors 62 and 66, resistors 64 and 68, and a diode 65. A first electrode of capacitor 62 serves as an input terminal 61 of sampling circuit 54 and is connected to the drain electrode of MESFET 11. A second electrode of capacitor 62 is connected to a first electrode of resistor 64 and to an anode of diode 65. A cathode of diode 65, a first electrode of capacitor 66, and a first electrode of resistor 68 are connected together to form an output terminal 69 of sampling circuit 54. The second electrodes of resistor 64, capacitor 66, and resistor 68 are connected to conductor 33.

Summing circuit 56 includes a resistor 74 and a voltage divider formed by 76 and 78. A first electrode of resistor 76 serves as a first input terminal of summing circuit 56 and is connected to output terminal 69 of sampling circuit 54. A second electrode of resistor 76 is connected to a first electrode of resistor 74 and to a first electrode of resistor 78. A second electrode of resistor 78 serves as a second input terminal of summing circuit 56 and is connected to bias terminal 47 for receiving a constant biasing signal. A second electrode of resistor 74 serves as an output terminal of summing circuit 56 and is connected to the gate electrode of MESFET 21. Resistor 74 serves as an AC signal blocking element to block the transmission of an AC signal from the gate electrode of MESFET 21 to resistors 76 and 78.

It should be understood that power amplifier 50 is not limited to having exactly the same structure as shown in FIG. 2. For example, the gate electrode of MESFET 11 may be coupled to input terminal 31 of power amplifier 50 via an input impedance matching network. Likewise, the drain electrode of MESFET 21 may be coupled to output terminal 41 of power amplifier 50 via an output impedance matching network.

MESFETs 11 and 21 serve as two amplifier stages in power amplifier 50, i.e., each of MESFETs 11 and 21 functions as an amplifier. More particularly in the structure shown in FIG. 2, the gate electrode of MESFET 11 functions as an input terminal as well as a biasing terminal of an amplifier, and the drain electrode of MESFET 11 functions as an output terminal of the amplifier. Likewise, the gate electrode of MESFET 21 functions as an input terminal as well as a biasing terminal of an amplifier, and the drain electrode of MESFET 21 functions as an output terminal of the amplifier. Accordingly, MESFETs 11 and 21 may be replaced with other amplifier circuit elements. For example, MESFETs 11 and 21 may be replaced with insulated gate field effect transistors, bipolar transistors, insulated gate bipolar transistors, and etc. When replacing a MESFET with another type of transistor, it should be noted that the gate electrode of a MESFET usually constitutes a control electrode of a transistor and the source and drain electrodes of the MESFET constitute current conducting electrodes of the transistor.

Inductor 12 serves as an AC signal decoupling element to provide a current path for the quiescent drain current in MESFET 11, block the transmission of an AC signal to gain control terminal 35, and generate an AC voltage signal at the drain electrode of MESFET 11. Likewise, inductor 22 serves as an AC signal decoupling element to provide a current path for the quiescent drain current in MESFET 21, block the transmission of an AC signal to conductor 45, and generate an AC voltage signal at the drain electrode of MESFET 21. Accordingly inductors 12 and 22 may be replaced with other circuit elements such as, for example, resistors, low frequency signal filtering circuits, etc. Resistors 14 and 74 serve as AC signal blocking elements for providing quiescent biasing signals to the gate electrodes of MESFETs 11 and 21, respectively, and blocking the transmission of AC signals to conductor 33 and bias terminals 37 and 47. They may be replaced with other circuit elements such as, for example, inductors, low frequency signal filtering circuits, etc.

Sampling circuit 54 generates a peak voltage signal corresponding to the magnitude of an AC signal at input terminal 61 of sampling circuit 54. More particularly, sampling circuit 54 generates a peak voltage signal which is proportional to the peak amplitude of the AC signal at input terminal 61. In operation, sampling circuit 54 functions as a rectifying and filtering circuit, in which capacitor 62 serves as a direct current (DC) signal decoupling element, diode 65 serves as a rectifier, and capacitor 66 and resistor 68 form a low pass filter. Therefore, capacitor 62 may be replaced with any high frequency signal filtering circuits. Diode 65 may be replaced with other rectifiers such as, for example, a full-wave diode bridge rectifier. Further, the low pass filter formed by capacitor 66 and resistor 68 may be replaced with any low frequency signal filtering circuits.

It should be understood that input terminal 61 of sampling circuit 54 is not limited to being connected to the drain electrode of MESFET 11. In accordance with the present invention, input terminal 61 is preferably coupled for receiving an AC signal having an amplitude related to the output power of power amplifier 50. Accordingly, in accordance with alternative embodiments of the present invention, input terminal 61 of sampling circuit 54 may be connected to the gate electrode of MESFET 11, the gate electrode of MESFET 21, the drain electrode of MESFET 21, the output of an amplifier stage (not shown) preceding power amplifier 50, or the like.

In operation, an input signal of power amplifier 50 is transmitted to the gate electrode of MESFET 11 via input terminal 31. MESFET 11 generates an intermediate AC signal at its drain electrode by amplifying the input signal. A first portion of the intermediate AC signal is transmitted to the gate electrode of MESFET 21 via impedance matching element 30. MESFET 21 amplifies the first portion of the intermediate AC signal and generates an output signal of power amplifier 50 at output terminal 41.

A second portion of the intermediate AC signal at the drain electrode of MESFET 11 is transmitted to diode 65 via input terminal 61 of sampling circuit 54 and capacitor 62. Diode 65 rectifies the second portion of the intermediate AC signal. The rectified signal is filtered by the low pass filter formed by capacitor 66 and resistor 68. Thus, sampling circuit 54 generates a bias adjusting signal at output terminal 69 of sampling circuit 54. The bias adjusting signal is corresponding to the magnitude of an envelope of the intermediate AC signal. More particularly, the bias adjusting signal is proportional to the peak amplitude of the intermediate AC signal at the drain electrode of MESFET 11. Summing circuit 56 combines the bias adjusting signal at output terminal 69 of sampling circuit 54 and a gate bias voltage signal or gate bias voltage level at bias terminal 47 to generate a dynamic biasing signal serving as the gate bias of MESFET 21. The larger the amplitude of the intermediate AC signal, the higher the gate bias of MESFET 21 and the larger quiescent drain current in MESFET 21. When power amplifier 50 generates a maximum output power, the quiescent drain current in MESFET 21 is preferably sufficient to ensure an adequate gain of power amplifier 50 to achieve the maximum output power.

The gain of power amplifier 50 is controlled or adjusted by the voltage level at gain control terminal 35. When a lower output power is desired, circuitry (not shown) generates a gain control signal which lowers the voltage level at gain control terminal 35 to adjust the gain of MESFET 11, thereby decreasing the amplitude of the intermediate AC signal at the drain electrode of MESFET 11. A decrease in the amplitude of the intermediate AC signal at input terminal 61 of sampling circuit 54 results in a smaller bias adjusting signal at output terminal 69 of sampling circuit 54. The smaller bias adjusting signal is combined with the gate bias voltage signal at bias terminal 47 to generate a lower dynamic biasing signal at the gate electrode of MESFET 21. Thus, MESFET 21 conducts a smaller quiescent drain current. By reducing the quiescent drain current of MESFET 21, the efficiency of power amplifier 50 is improved compared with power amplifier 10 of FIG. 1. Because MESFET 21 generally conducts a larger quiescent drain current than MESFET 11, decreasing the quiescent drain current of MESFET 21 is an effective approach for improving the efficiency of power amplifier 50.

By now it should be appreciated that a dynamic biasing circuit and a method for dynamically biasing a variable gain amplifier have been provided. In accordance with the present invention, when the output power level of the variable gain amplifier decreases, the dynamic biasing circuit decreases the quiescent current in the amplifier accordingly. Therefore, dynamically biasing the amplifier greatly improves the efficiency of the amplifier at low output power levels. Further, the dynamic biasing circuit of the present invention is simple, inexpensive, and adds little in size and weight to the amplifier. In mobile wireless communication applications such as cellular telephone applications, the dynamic biasing circuit of the present invention provides a cellular telephone with the benefit longer talking time between battery recharges and/or smaller batteries.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention.

We claim:

1. A method for dynamically biasing an amplifier, comprising the steps of:

providing a direct current (DC) signal:

generating an alternating current (AC) signal;

generating a bias adjusting signal corresponding to an envelope of the AC signal;

applying the bias adjusting signal and the DC signal to a voltage divider to generate a dynamic biasing signal; and applying the dynamic biasing signal to a biasing terminal of the amplifier.

2. The method of claim 1, wherein the step of generating an AC signal further includes transmitting an input signal to an amplifier stage to generate the AC signal.

3. The method of claim 2, further comprising the step of adjusting a gain of the amplifier stage to vary the magnitude of the AC signal.

4. The method of claim 1, wherein the step of generating a bias adjusting signal further includes rectifying and filtering a portion of the AC signal.

5. The method of claim 1, further comprising the step transmitting a portion of the AC signal to an input terminal of the amplifier.

6. A method for dynamically biasing an amplifier stage, comprising the steps of:

generating a peak voltage proportional to an envelope of a signal corresponding to an input signal of the amplifier stage;

generating a dynamic bias by summing the peak voltage and a bias voltage in a voltage divider; and applying the dynamic bias to the amplifier stage.

7. The method of claim 6, wherein the step of generating a peak voltage further includes rectifying and filtering the signal corresponding to the input signal of the amplifier stage.

8. A dynamic biasing circuit for biasing an amplifier having a biasing terminal, comprising:

a sampling circuit having an input terminal coupled for receiving an alternating current (AC) signal, and an output terminal; and a voltage dividing circuit having a first input terminal coupled to the output terminal of said sampling circuit, a second input terminal coupled for receiving a bias voltage, and an output terminal coupled to the biasing terminal of the amplifier.

9. The dynamic biasing circuit of claim 8, wherein said sampling circuit includes:

a first capacitor having a first electrode coupled to the input terminal of said sampling circuit, and a second electrode;

a first resistor having a first electrode coupled to the second electrode of said first capacitor, and a second electrode coupled to a reference voltage level;

a diode having an anode coupled to the second electrode of said first capacitor, and a cathode coupled to the output terminal of said sampling circuit;

a second capacitor having a first electrode coupled to the cathode of said diode, and a second electrode coupled to the second electrode of said first resistor; and a second resistor having a first electrode coupled to the first electrode of said second capacitor, and a second electrode coupled to the second electrode of said second capacitor.

10. The dynamic biasing circuit of claim 8, wherein said voltage dividing circuit includes:

a first resistor having a first electrode coupled to the first input terminal of said voltage dividing circuit, and a second electrode coupled to the output terminal of said voltage dividing circuit; and a second resistor having a first electrode coupled to the second electrode of said first resistor, and a second electrode coupled to the second input terminal of said voltage dividing circuit.

11. The dynamic biasing circuit of claim 10, wherein the second electrode of said first resistor is coupled to the output terminal of said voltage dividing circuit via an AC signal blocking element.

12. The dynamic biasing circuit of claim 11, wherein said AC signal blocking element includes a third resistor having a first electrode coupled to the second electrode of said first resistor and a second electrode coupled to the output terminal of said voltage dividing circuit.

13. A variable gain amplifier, comprising:
- a first transistor having a control electrode coupled for receiving an input signal, a first current conducting electrode coupled to a reference voltage level, and a second current conducting electrode;
- a first alternating current (AC) signal decoupling element having a first electrode coupled for receiving a gain control signal, and a second electrode coupled to the second current conducting electrode of said first transistor;
- a first voltage divider having a first input terminal coupled to the reference voltage level, a second input terminal coupled to a first bias voltage level, and an output terminal coupled to the control electrode of said first transistor;
- a second transistor having a control electrode coupled to the second current conducting electrode of said first transistor, a first current conducting electrode coupled to the reference voltage level, and a second current conducting electrode coupled for transmitting an output signal;
- a second AC signal decoupling element having a first electrode coupled to a supply voltage level, and a second electrode coupled to the second current conducting electrode of said second transistor; and
- a dynamic biasing circuit which comprises:
  - a sampling circuit having an input terminal coupled to the second current conducting electrode of said first transistor, and an output terminal; and
  - a second voltage divider having a first input terminal coupled to the output terminal of said sampling circuit, a second input terminal coupled to a second bias voltage level, and an output terminal coupled to the control electrode of said second transistor.

14. The variable gain amplifier of claim 13, wherein said sampling circuit includes:
- a first capacitor having a first electrode coupled to the input terminal of said sampling circuit, and a second electrode;
- a first resistor having a first electrode coupled to the second electrode of said first capacitor, and a second electrode coupled to the reference voltage level;
- a diode having an anode coupled to the second electrode of said first capacitor, and a cathode coupled to the output terminal of said sampling circuit;
- a second capacitor having a first electrode coupled to the cathode of said diode, and a second electrode coupled to the second electrode of said first resistor; and
- a second resistor having a first electrode coupled to the first electrode of said second capacitor, and a second electrode coupled to the second electrode of said second capacitor.

15. The variable gain amplifier of claim 13, wherein said second voltage divider includes:
- a first resistor having a first electrode coupled to the first input terminal of said second voltage divider, and a second electrode coupled to the output terminal of said second voltage divider; and
- a second resistor having a first electrode coupled to the second electrode of said first resistor, and a second electrode coupled to the second input terminal of said second voltage divider.

16. The variable gain amplifier of claim 13, wherein the output terminal of said second voltage divider is coupled to the control electrode of said second transistor via an AC signal blocking element, said AC signal blocking element having a first electrode coupled to the output terminal of said second voltage divider and a second electrode coupled to the control electrode of said second transistor.

17. The variable gain amplifier of claim 16, wherein said AC signal blocking element includes a resistor having a first electrode coupled to the first electrode of said AC signal blocking element, and a second electrode coupled to the second electrode of said AC signal blocking element.

18. The variable gain amplifier of claim 13, wherein said first voltage divider includes:
- a first resistor having a first electrode coupled to the first input terminal of said first voltage divider, and a second electrode coupled to the output terminal of said first voltage divider; and
- a second resistor having a first electrode coupled to the second electrode of said first resistor, and a second electrode coupled to the second input terminal of said first voltage divider.

19. The variable gain amplifier of claim 13, wherein the output terminal of said first voltage divider is coupled to the control electrode of said first transistor via a resistor.

20. The variable gain amplifier of claim 13, wherein the control electrode of said second transistor is coupled to the second current conducting electrode of said first transistor via an impedance matching element.

* * * * *